United States Patent
Chiu et al.

(10) Patent No.: US 11,306,841 B2
(45) Date of Patent: Apr. 19, 2022

(54) QUICK RELEASE PURGE VALVE AND SUBSTRATE CONTAINER USING SAME

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Hsin-Min Hsueh, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 17/102,920

(22) Filed: Nov. 24, 2020

(65) Prior Publication Data

US 2021/0080020 A1 Mar. 18, 2021

Related U.S. Application Data

(63) Continuation of application No. 16/237,818, filed on Jan. 2, 2019, now Pat. No. 10,876,647.

(60) Provisional application No. 62/615,986, filed on Jan. 11, 2018.

(51) Int. Cl.
| | |
|---|---|
| *F16K 24/04* | (2006.01) |
| *B01D 46/42* | (2006.01) |
| *B01D 46/10* | (2006.01) |
| *F16K 27/02* | (2006.01) |
| *H01L 21/677* | (2006.01) |

(52) U.S. Cl.
CPC .............. *F16K 24/04* (2013.01); *B01D 46/10* (2013.01); *B01D 46/4272* (2013.01); *F16K 27/0209* (2013.01); *H01L 21/67793* (2013.01)

(58) Field of Classification Search
CPC ..... F16K 24/04; F16K 27/0209; B01D 46/10; B01D 46/4272; H01L 21/67793; H01L 21/6735; H01L 21/67359; H01L 21/673; H01L 21/67; B65D 85/48
USPC ......... 206/710, 1.5, 712; 220/326, 324, 254, 220/371; 215/308
See application file for complete search history.

(56) References Cited

U.S. PATENT DOCUMENTS

| | | | |
|---|---|---|---|
| 6,187,182 B1 * | 2/2001 | Reynolds ............... | B01D 46/10 |
| | | | 210/136 |
| 7,201,276 B2 * | 4/2007 | Burns ............... | H01L 21/67379 |
| | | | 206/710 |
| 7,455,180 B2 * | 11/2008 | Sumi ................ | H01L 21/67379 |
| | | | 206/710 |

(Continued)

*Primary Examiner* — Chun Hoi Cheung
(74) *Attorney, Agent, or Firm* — Locke Lord LLP; Tim Tingkang Xia, Esq.

(57) ABSTRACT

A quick release purge valve and a substrate container using same are provided. The container includes a base which has a cover plate and a bottom plate. The quick release purge valve includes a snap plate, a gasket fitting, and a valve element. The snap plate detachably engages with the bottom plate and is at most evenly aligned with the bottom plate. The gasket fitting is disposed between the cover plate and the bottom plate and has an airflow conduit communicating the two plates. The valve element is disposed in the conduit for limiting a flow direction of the gas. The gasket fitting is fixed in the base when the snap plate and the bottom plate are in an engaged state and is removable from the base when the snap plate and the bottom plate are in a disengaged state.

17 Claims, 8 Drawing Sheets

(56) References Cited

U.S. PATENT DOCUMENTS

| | | | | |
|---|---|---|---|---|
| 8,091,592 B2* | 1/2012 | Sato | ............ | H01L 21/67393 |
| | | | | 141/63 |
| 8,403,143 B2* | 3/2013 | Chiu | ............ | H01L 21/67353 |
| | | | | 206/454 |
| 8,727,125 B2* | 5/2014 | Tieben | ............ | H01L 21/67769 |
| | | | | 206/711 |
| 9,312,157 B2* | 4/2016 | Adams | ............ | H01L 21/67386 |
| 10,388,554 B2* | 8/2019 | Gregerson | ............ | H01L 21/67376 |
| 10,453,723 B2* | 10/2019 | Kasama | ............ | H01L 21/67393 |
| 2003/0047562 A1* | 3/2003 | Wu | ............ | B65D 51/1616 |
| | | | | 220/300 |
| 2010/0163452 A1* | 7/2010 | Lin | ............ | H01L 21/67393 |
| | | | | 206/711 |
| 2017/0271188 A1* | 9/2017 | Fuller | ............ | H01L 21/67393 |

* cited by examiner

QUICK RELEASE PURGE VALVE AND SUBSTRATE CONTAINER USING SAME

RELATED APPLICATIONS

This application is a continuation application of U.S. non-provisional application Ser. No. 16/237,818, filed Jan. 2, 2019 which claims priority to U.S. Provisional Patent Application, No. 62/615,986, filed Jan. 11, 2018 which is hereby incorporated by reference herein in their entirety.

BACKGROUND OF THE INVENTION

Field of the Invention

The present invention relates to a quick release purge valve. More particularly, the present invention relates a quick release purge valve applied in a substrate container.

Description of the Prior Art

Along with the development of technology, the technologies related to semiconductor manufacturing advance rapidly. Among the manufacturing processes, the photolithography process plays a key role. Photolithography involves patterning the light permeable reticle with predefined pattern, projecting the pattern on the reticle onto a wafer by exposing to a light source. As a result, the pattern can be transferred and developed on the wafer. During the photolithography process, any particle attached on the reticle would deteriorate the image quality projected onto the wafer. Especially, with the development trend of miniaturizing the linewidth in recent years, the industry tends to develop smaller, higher logic density chips. The wavelength of the light source used by the photolithography equipment has been narrowed down to the range of extreme ultraviolet light (EUV). As a result, the manufacturers must set stricter standards for the number of particles, the size of particles, and the cleanliness inside the reticle pod.

One known method of maintaining the cleanliness is to install one or more purge valves on the reticle pod and to provide gas flowing through the purge valves. Practically, the gas is provided at a certain flow rate to flow through the purge valve to maintain the replacement rate of the gas in the reticle pod, and to optimize the storage environment for the reticle. The filtration sheet used for filtering out the particles in the gas is disposed at the purge valves of the reticle pod. After several times of use, the filtration sheet must be replaced to maintain the filtration effect.

In one known reticle pod, the filtration sheet, the purge valve, or other related components are assembled and fixed to the base of the reticle pod through one or more screws. When any one of the components, e.g. the filtration sheet, needs to be replaced, the screws need to be removed first and then the bottom plate of the base must be entirely removed as well. After removing all these components, the filtration sheet can then be replaced. After the filtration sheet is replaced, the bottom plate must be reinstalled, and the screws must be driven back into the base. The work of screwing, removing, and reinstalling is quite time consuming, making the component replacement process very inefficient.

SUMMARY OF THE INVENTION

In view of the above-mentioned problems, the present invention is to provide a quick release purge valve and a substrate container using the same, which use a detachable snap plate to increase the convenience of replacing the components.

According to one aspect of the invention, a quick release purge valve configured to allow a gas entering or leaving a substrate container is provided. The substrate container has a cover plate and a bottom plate. The quick release purge valve includes a snap plate, a gasket fitting, and a valve element. The snap plate is detachably engaged to a first opening of the bottom plate and is at most evenly aligned with the bottom plate. The gasket fitting is disposed between the cover plate and the bottom plate and has an airflow conduit communicating the cover plate and the bottom plate. The valve element is disposed in the airflow conduit for limiting a flow direction of the gas. The gasket fitting is configured to be fixed in the base when the snap plate and the bottom plate are in an engaged state and to be removable from the base when the snap plate and the bottom plate are in a disengaged state.

In one embodiment, the snap plate includes a main body and an elastic arm. The main body is used for fixing to one side of the gasket fitting, and one end of the elastic arm is connected to the main body and the other end of the elastic arm is used for engaging with the bottom plate.

In another embodiment, the main body has a circular structure, and the circular structure is configured to surround the gasket fitting and to avoid the airflow conduit.

In yet another embodiment, the gasket fitting has a protruded ring situated on an outer wall of the gasket fitting, and an outer diameter of the protruded ring is larger than an inner diameter of the main body.

In a further embodiment, the bottom plate has a protruded edge and an engaging recess. The protruded edge is used for fixing a location of the main body in the first opening, and the engaging recess is used for engaging with the elastic arm thereby engaging the snap plate with the bottom plate.

In another embodiment, wherein the other side of the gasket fitting is used for pressing against the cover plate in proximity to a second opening of the cover plate, and the gas enters or leaves the substrate container through the first opening, the airflow conduit, and the second opening.

In yet another embodiment, wherein the cover plate has a fitting sleeve surrounding the second opening, and the gasket fitting is used for slidably fitting with or removing from the fitting sleeve.

In a further embodiment, when the gasket fitting is fitted with the fitting sleeve, an air-tight state is formed between the fitting sleeve and the outer wall of the gasket fitting.

According to another aspect of the invention, a substrate container is provided. The substrate container includes an inner box assembly for accommodating a substrate and an outer box assembly for accommodating the inner box assembly. The outer box assembly includes a base and an outer cover. The base includes a bottom plate having a first opening, a cover plate, and a quick release purge valve configured to allow a gas entering or leaving the substrate container. The quick release purge valve includes a snap plate, a gasket fitting, and a valve element. The snap plate is detachably engaged to the first opening and is at most evenly aligned with the bottom plate. The gasket fitting is disposed between the cover plate and the bottom plate and has an airflow conduit communicating the cover plate and the bottom plate. The valve element is disposed in the airflow conduit for limiting a flow direction of the gas. The outer cover is used for engaging with the base to form a sealed state therebetween. The gasket fitting is configured to be fixed in the base when the snap plate and the bottom plate are in an engaged state and to be removable from the base when the snap plate and the bottom plate are in a disengaged state.

In one embodiment, the base further includes a filtration element disposed between the cover plate and the gasket fitting for filtering the gas.

According to the disclosure of the embodiments of the invention, the quick release purge valve and the substrate container using the same use the detachable snap plate to fix the gasket fitting. When the snap plate and the bottom plate are in the disengaged state, the gasket fitting is removable from the base, which facilitates component replacement by the user, and thus the work time can be saved and the work efficiency can be increased. Further, the snap plate is at most evenly aligned with the bottom plate to keep the bottom of the substrate container a flat surface, which is advantageous to the transportation of the substrate container and beneficial for keeping the cleanliness as well.

BRIEF DESCRIPTION OF THE DRAWINGS

The invention can be more fully understood by reading the following detailed description of the embodiment, with reference made to the accompanying drawings as follows:

FIG. 4b is a partial enlarged view of the cross-sectional view in FIG. 4a;

FIG. 5b is an exploded view of the quick release purge valve of FIG. 5a; and

DETAILED DESCRIPTION OF THE EMBODIMENTS

In the embodiments of the quick release purge valve and the substrate container using the same according to the embodiments of the invention, the quick release purge valve allows the gas entering or leaving the substrate container. The substrate container includes a base having a cover plate and a bottom plate. The quick release purge valve includes a snap plate, a gasket fitting, and a valve element. The snap plate is detachably engaged to a first opening of the bottom plate and is at most evenly aligned with the bottom plate. The gasket fitting is disposed between the cover plate and the bottom plate and has an airflow conduit communicating the cover plate and the bottom plate. The valve element is disposed in the airflow conduit for limiting the flow direction of the gas.

The gasket fitting is configured to be fixed in the base when the snap plate and the bottom plate are in an engaged state, so that the gasket fitting can be prevented from moving out of the base. The gasket fitting is configured to be removable from the base when the snap plate and the bottom plate are in a disengaged state. The snap plate is used such that the convenience of replacing the component can be increased. The complicated process of known method including removing the screws and the bottom plate can be eliminated. The efficiency can therefore be increased, and the time that the substrate container stays off the manufacturing line due to component replacement can be shortened. Furthermore, since the snap plate is at most evenly aligned with the bottom plate, the bottom of the substrate container can be kept flat, which is advantageous to the transportation of the substrate container and beneficial for keeping the cleanliness as well.

Figure 1:
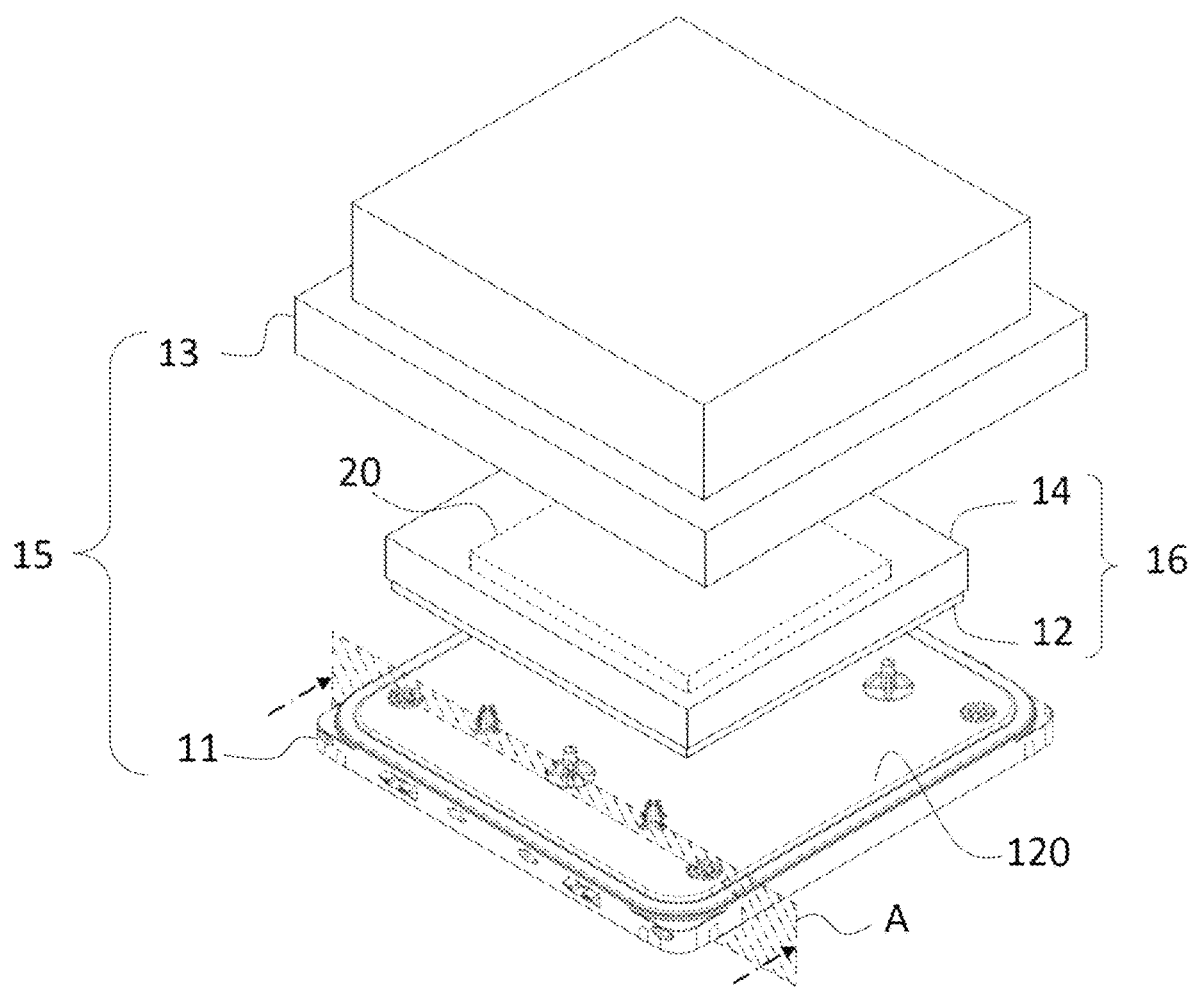
FIG. 1 is a perspective view of a substrate container according to one embodiment of the invention.

Please refer to FIG. 1, which is a perspective view of a substrate container according to one embodiment of the invention. The substrate container 10 includes an outer box assembly 15 and an inner box assembly 16. The outer box assembly 15 is used for accommodating the inner box assembly 16, and the inner box assembly 16 is used for accommodating a substrate 20. The outer box assembly 15 includes a base 11 and an outer cover 13. The outer cover 13 is used for engaging with the base 11 so that a sealed state is formed between them to separate the inside of the outer box assembly 15 from the outside. The required level of cleanliness inside the outer box assembly 15 can be achieved accordingly. The inner box assembly 16 includes a first part 12 and a second part 14 which matches with the first part 12. When the first part 12 engages with the second part 14, an accommodation space is formed between the two parts 12 and 14. The accommodation space is used to accommodate the substrate 20. In the present embodiment, the substrate 20 can be exemplified by an EUV reticle implemented in the patterning process of high-density, high-precision semiconductor. However, in a different embodiment, the substrate 20 can be exemplified by other types of slate components that has a high demand for cleanliness and can be implemented in the semiconductor manufacturing process.

Figure 2:
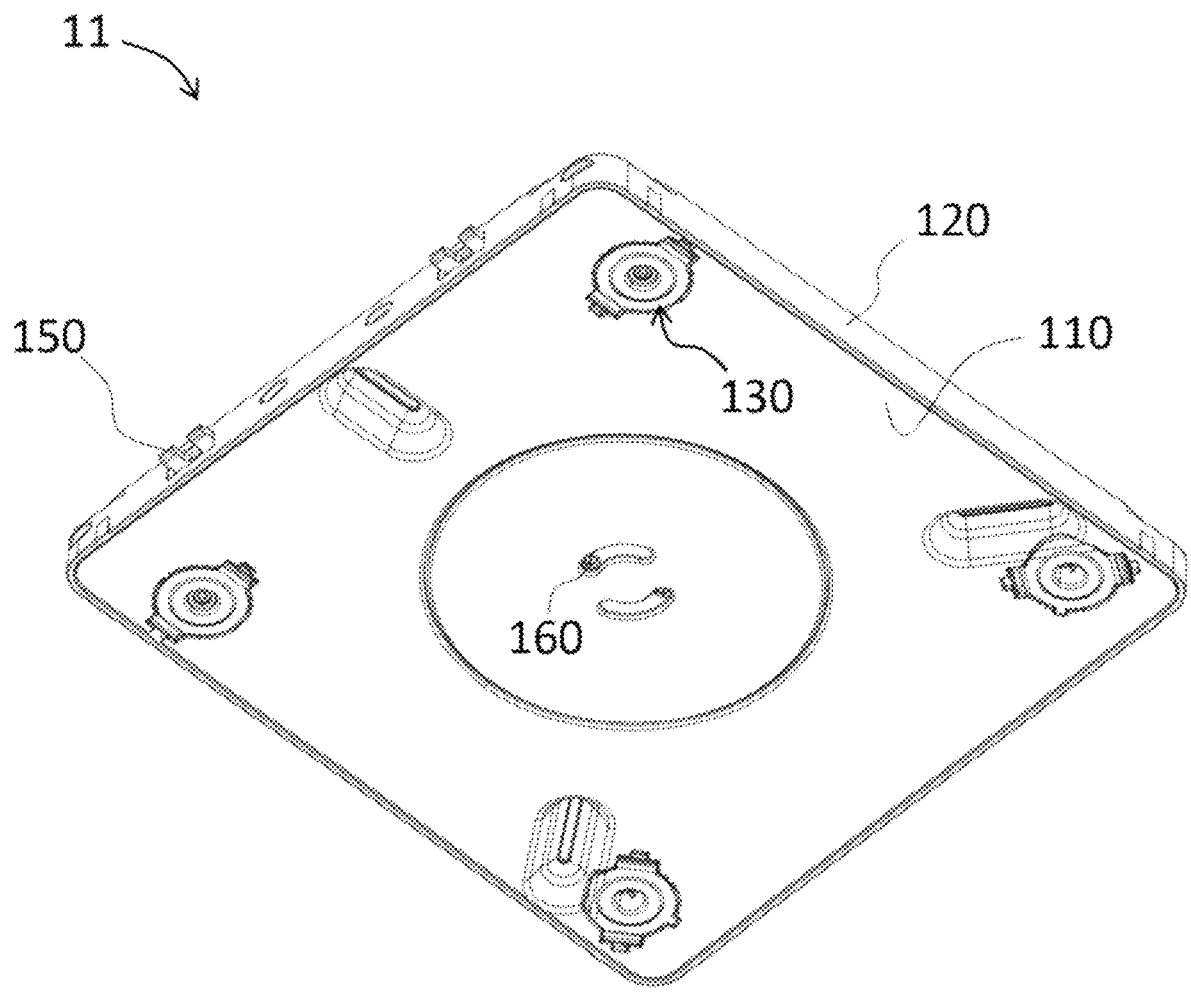
FIG. 2 is a perspective view of the base of FIG. 1 from another view angle.

Please refer to FIG. 1 and FIG. 2 at the same time. FIG. 2 is a perspective view of the base of FIG. 1 from another view angle. In the present embodiment, the base 11 includes a cover plate 120, a bottom plate 110, and a quick release purge valve 130. The cover plate 120 and the bottom plate 110 are configured to be put together and assembled with each other. According to practical product needs, the base 11 can further include a locking element 150 and a driving mechanism 160 for driving the locking element 150, so as to firmly lock the outer cover 13 with the base 11. The quick release purge valve 130 allows a gas entering or leaving the substrate container 10. In the present embodiment, the base 11 is exemplified by including four quick release purge valves 130, as shown in FIG. 2. Two of the quick release purge valves 130 allow the gas entering the substrate container 10 and the other two allow the gas leaving the substrate container 10. However, the number and disposition of the quick release purge valves 130 are not limited hereto, other amount and disposition can also be used in the present invention.

Figure 3:
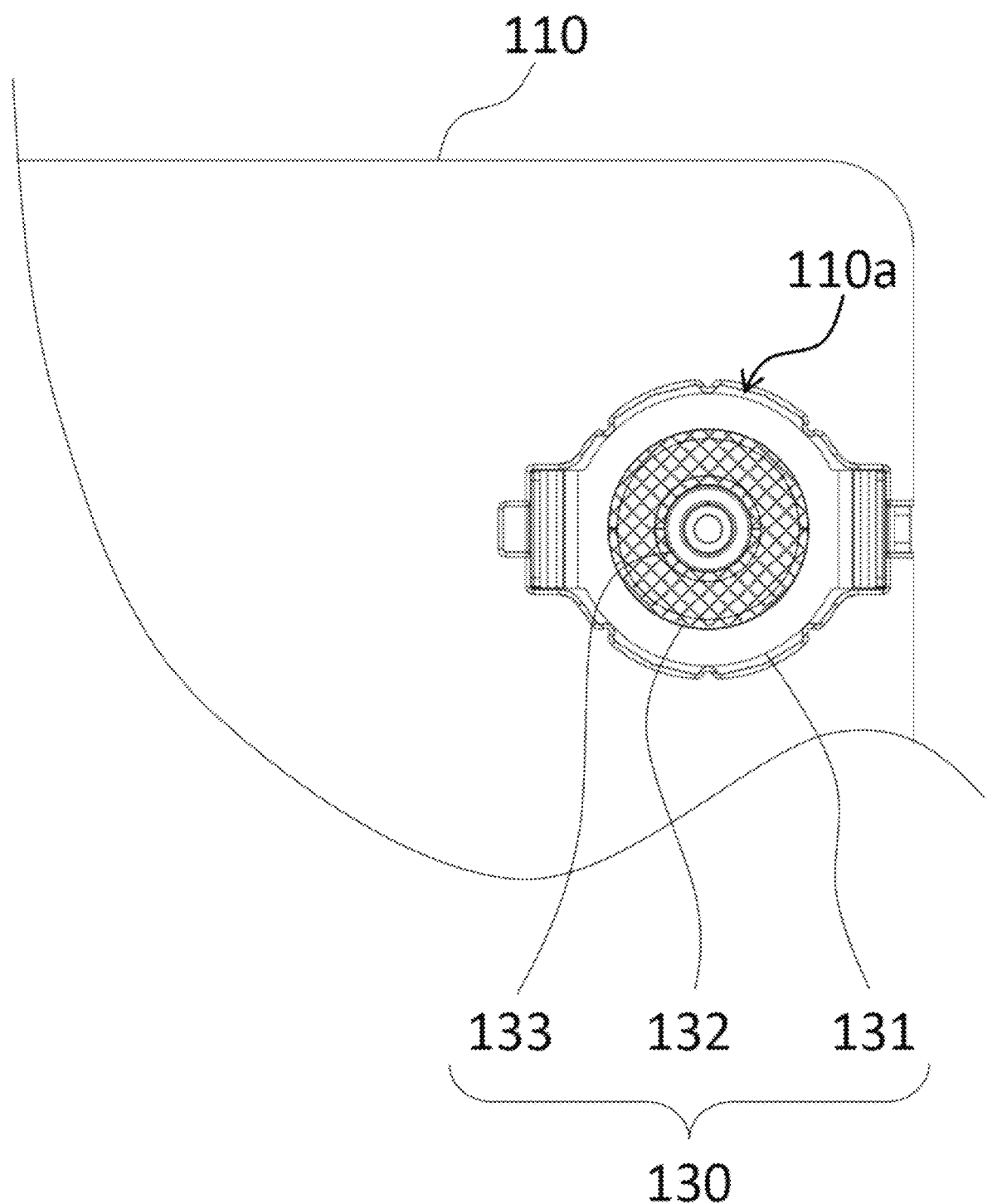
FIG. 3 is an enlarged view of one quick release purge valve of the base of FIG. 2.
Figure 4A:
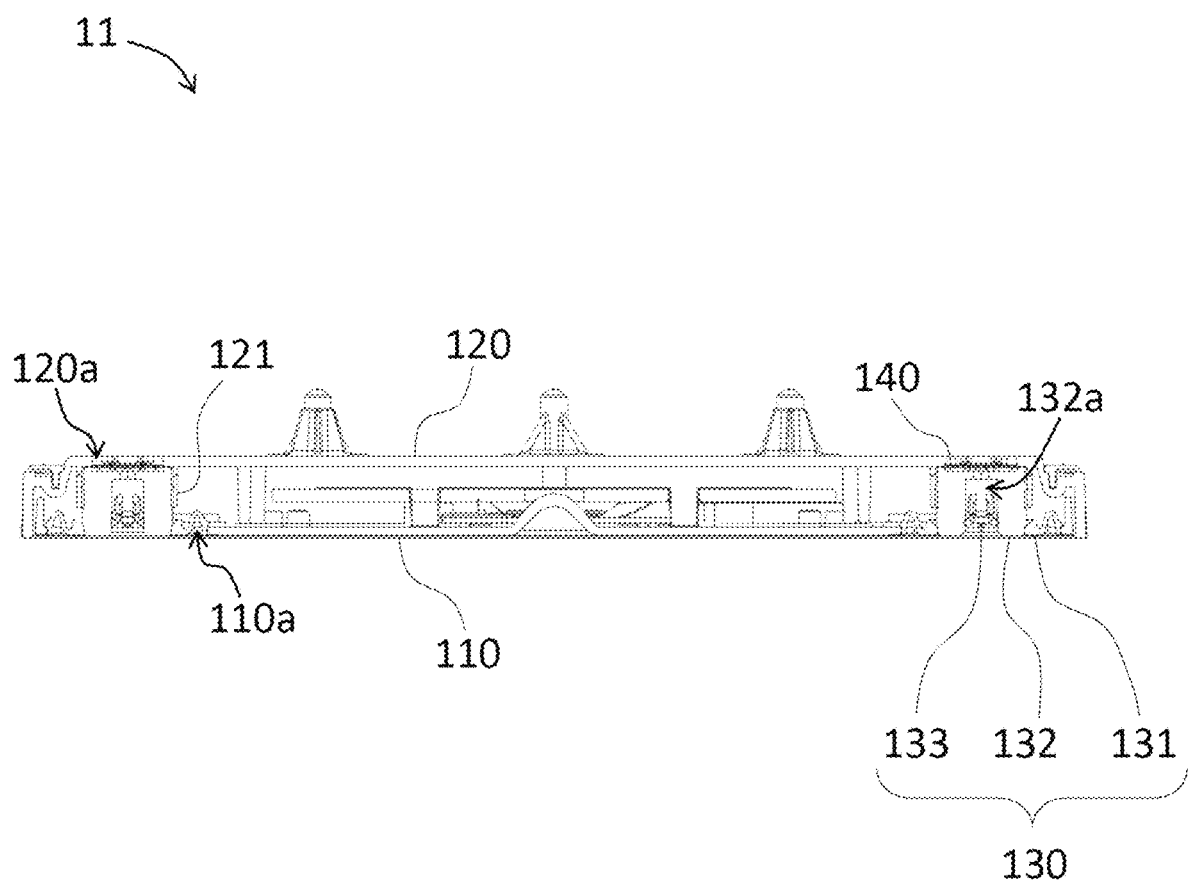
FIG. 4a is a cross-sectional view of the base taken along plane A in FIG. 1.

Please refer to FIG. 3 and FIG. 4a at the same time. FIG. 3 is an enlarged view of one quick release purge valve of the base of FIG. 2. FIG. 4a is a cross-sectional view of the base taken along plane A in FIG. 1. The quick release purge valve 130 of the present embodiment includes a snap plate 131, a gasket fitting 132, and a valve element 133. The bottom plate 110 has a first opening 110a to which the snap plate 131 is detachably engaged. When the snap plate 131 is engaged with the bottom plate 110, the snap plate 131 is at most evenly aligned with the bottom plate 110. In other words, the snap plate 131 is not protruded from the bottom plate 110. The gasket fitting 132 is disposed between the cover plate 120 and the bottom plate 110 and has an airflow conduit 132a communicating the cover plate 120 and the bottom plate 110. The valve element 133 is disposed in the airflow conduit 132a for limiting a flow direction of the gas. When the snap plate 131 and the bottom plate 110 are in an engaged state (as the state of the snap plate 131 and bottom plate 110 shown in FIG. 2, FIG. 3, and FIG. 4a), the gasket fitting 132 is fixed by the snap plate 131, and the gasket fitting 132 can be prevented from moving out of the base 11. When the snap plate 131 and the bottom plate 110 are in a disengaged state (such state will be elaborated in the below), the gasket fitting 132 is removable from the base 11 so as to replace the related component in the base 11.

Figure 5A:
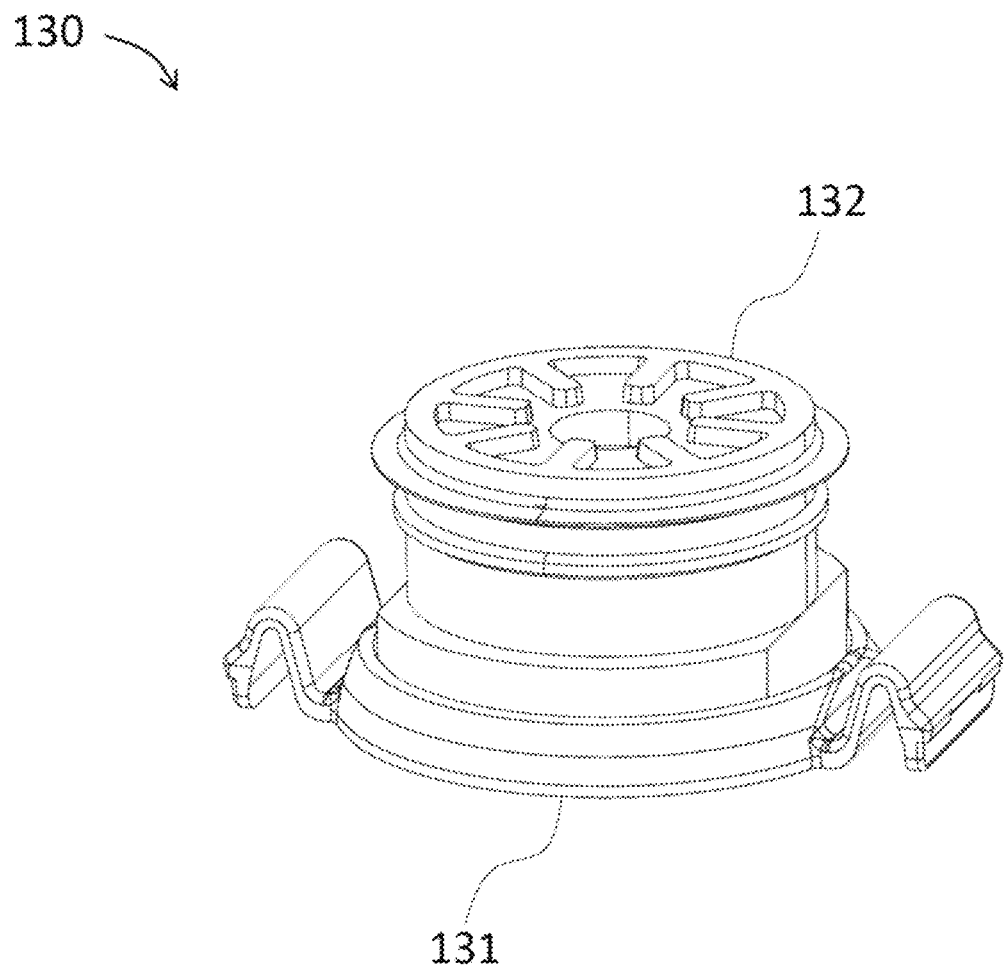
FIG. 5a is a perspective view of the quick release purge valve according to one embodiment of the invention.
Figure 5B:
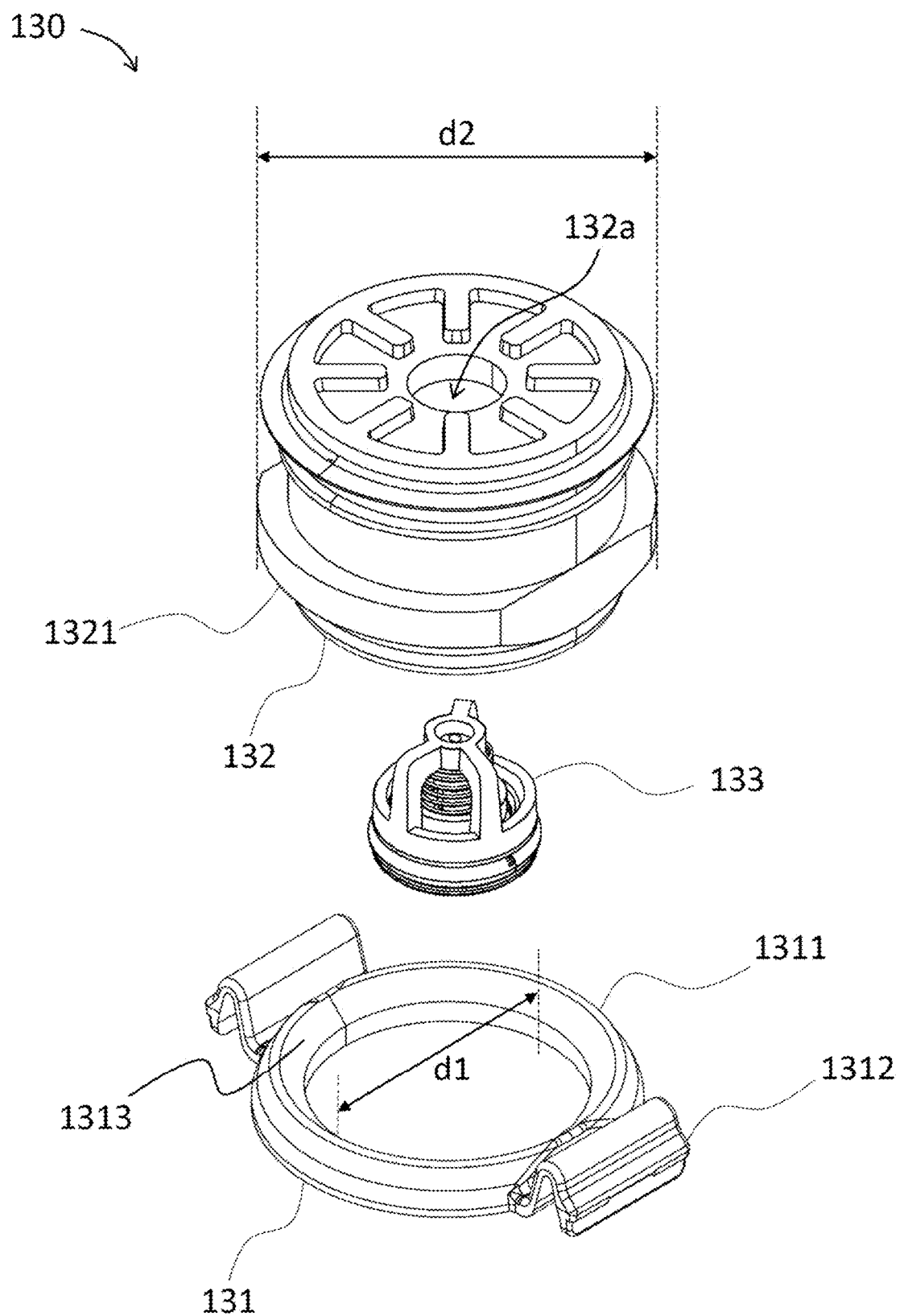

Please refer to FIG. 5a and FIG. 5b at the same time. FIG. 5a is a perspective view of the quick release purge valve according to one embodiment of the invention. FIG. 5b is an exploded view of the quick release purge valve of FIG. 5a. In the quick release purge valve 130 of the present embodiment, the snap plate 131 includes a main body 1311 and at least an elastic arm 1312. The main body 1311 is used to hold and fix to one side of the gasket fitting 132; in other words, the gasket fitting 132 abuts against the main body 1311 and therefore can be fixed. The main body 1311 of the present embodiment has a circular structure configured to surround the gasket fitting 132. The circular structure is also configured to avoid the airflow conduit 132a, so as not to interfere with the airflow of the gas.

Please refer to FIG. 4a, FIG. 4b, FIG. 5a, and FIG. 5b at the same time. One end of the elastic arm 1312 is connected to the main body 1311, and the other end is used for engaging with the bottom plate 110. In the present embodiment, the snap plate 131 is exemplified by having two elastic arms 1312 connecting to two opposite sides of the main body 1311. The snap plate 131 can therefore be firmly engaged with the bottom plate 110. The elastic arm 1312 has a curved section which is used to be elastically deformed to achieve snapping or elastically engaging with the bottom plate 110. The curved section recesses into the base 11, so the structure of the elastic arm 1312 is at most evenly aligned with the bottom of the bottom plate 110 (i.e. the elastic arm 1312 is not protruded from the bottom plate 110). As a result, the bottom of the substrate container 10 can be kept flat (as the substrate container 10 shown in FIG. 1) to facilitate the transportation of the substrate container 10, and the flat bottom of the base 11 can also help maintain the cleanliness.

Figure 4B:
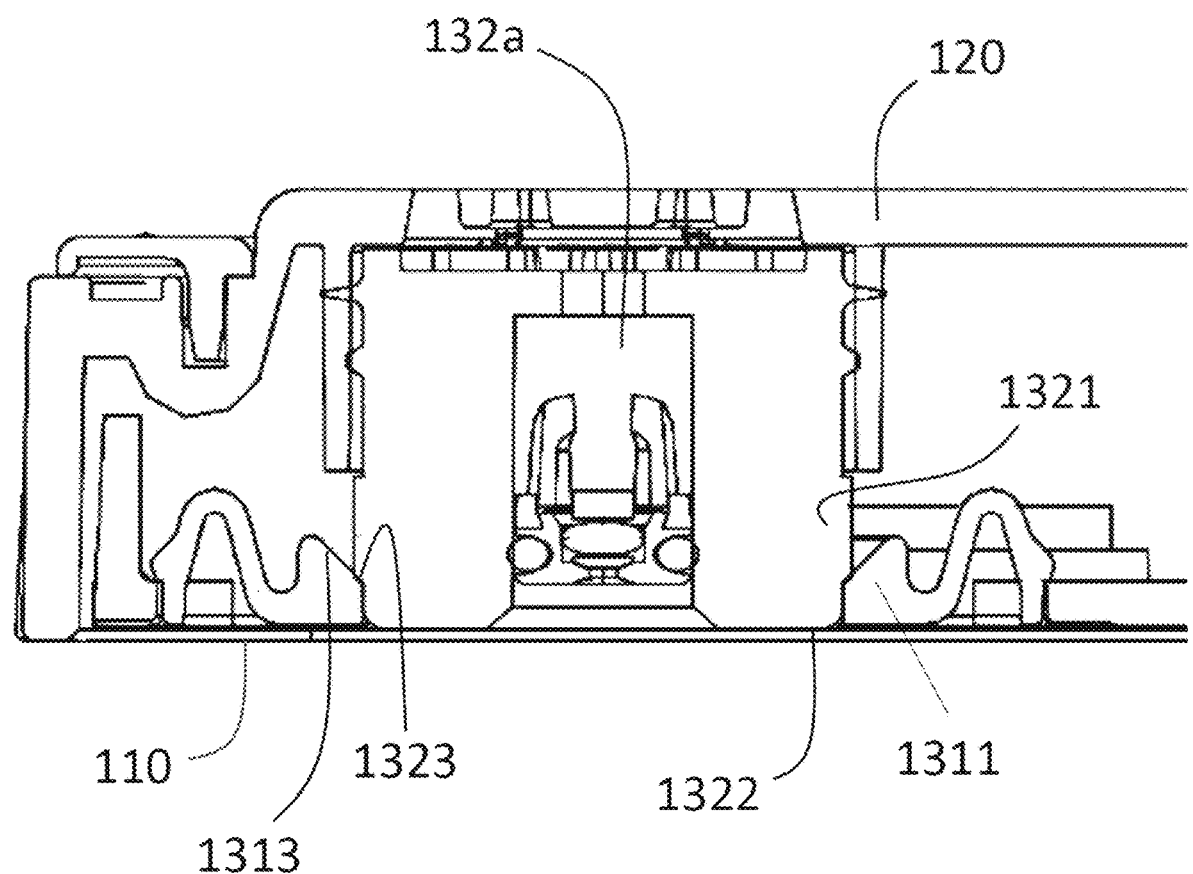

Of the quick release purge valve 130 according to the present embodiment of the invention, the gasket fitting 132 has a protruded ring 1321 situating on an outer wall of the gasket fitting 132. An outer diameter d2 of the protruded ring 1321 is larger than an inner diameter d1 of the main body 1311 of the snap plate 131, so the gasket fitting 132 can be prevented from going through the circular structure of the main body 1311 and can be effectively held and fixed by the main body 1311. As shown in FIG. 4b, the protruding ring 1321 is more approximate to an edge of the gasket fitting 132 at the side approximate to the bottom plate 110, and the protruding ring 1321 contacts with the circular structure of the main body 1311. The gasket fitting 132 further has a ring surface 1322 generally in parallel to the bottom plate 110, and the ring surface 1322 defines an opening of the airflow conduit 132a. An outer diameter of the ring surface 1322 is no greater than an inner diameter of the circular structure of the main body 1311. The ring surface 1322 extends between the bottom plate 110 and cover plate 120. As shown in FIG. 4b, a flange surface 1323 is formed on the outer wall of the gasket fitting 132. More specifically, the flange surface 1323 is the surface of the protruding ring 1321 facing to a surface of the bottom plate 110 and served as a ring structure for restricting the circular structure of the snap plate 131 to thereby locate the snap plate on the outer wall of the gasket fitting 132.

In the quick release purge valve 130 of the present embodiment, the valve element 133 is a check valve that can prevent reverse flow of the gas. Exemplarily, as shown in FIG. 5b, the valve element 133 allows the gas flows into the substrate container 10 (the substrate container 10 is shown in FIG. 1) only in the direction from bottom to top.

Figure 6:
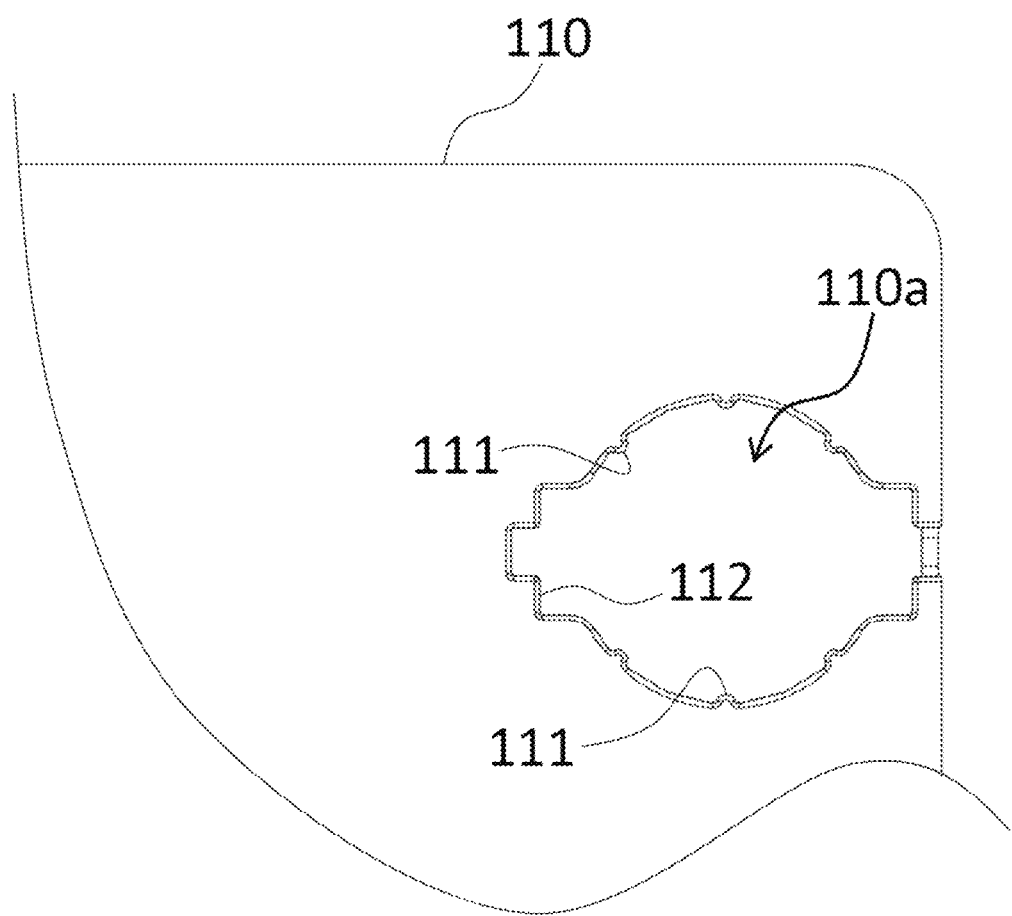
FIG. 6 is a perspective view of the bottom plate near one of the first openings.

Please refer to FIG. 3, FIG. 5b, and FIG. 6 at the same time. FIG. 6 is a perspective view of the bottom plate near one of the first openings. The snap plate 131 and the bottom plate 110 shown in FIG. 6 are in the disengaged state; that is, the snap plate 131 is not engaged with the bottom plate 110. The bottom plate 110 has a protruded edge 111 and an engaging recess 112 at the first opening 110a. The protruded edge 111 is used for fixing the location of the main body 1311 in the first opening 110a. The engaging recess 112 is used for engaging with the elastic arm 1312, thereby engaging the snap plate 131 with the bottom plate 110. In the present embodiment, the bottom plate 110 has several protruded edges 111 distributing along the first opening 110a to contact and fix the main body 1311 from multiple directions. The number of the engaging recess 112 corresponds to the elastic arm 1312, so each elastic arm 1312 could be engaged with one engaging recess 112.

The description of the embodiment continues with reference to FIG. 4a, FIG. 4b and FIG. 5b. As aforementioned, one side of the gasket fitting 132 abuts against the main body 1311 of the snap plate 131. In the present embodiment, the other side of the gasket fitting 132 is used for pressing against the cover plate 120 in proximity to a second opening 120a of the cover plate 120. The gas enters or leaves the substrate container 10 through the first opening 110a, the airflow conduit 132a, and the second opening 120a, or vice versa. The circular structure of the main body 1311 has a ring surface 1313 which is configured to contact with the flange surface 1323 of the gasket fitting 132 so that the gasket fitting 132 is unable to pass through the snap plate 131.

In the present embodiment, the cover plate 120 has a fitting sleeve 121 surrounding the second opening 120a. The gasket fitting 132 is used for slidably fitting with or removing from the fitting sleeve 121. When the gasket fitting 132 is fitted with the fitting sleeve 121, an air-tight state is formed between the fitting sleeve 121 and the outer wall of the gasket fitting 132. The gas leakage resulted from gas flowing into the space between the cover plate 120 and the bottom plate 110 can be prevented.

In the present embodiment, the base 11 further includes a filtration element 140 disposed between the cover plate 120 and the gasket fitting 132 for filtering the gas. When the snap plate 131 and the bottom plate 110 are in the disengaged state, the gasket fitting 132 is slidable and removable from the fitting sleeve 121, and the gasket fitting 132 can be completely removed from the base 11. After the gasket fitting 132 is removed from the base 11, the filtration element 140 can be replaced accordingly. By using a newly replaced or clean filtration element 140, the cleanliness of the gas can be kept. The filtration element 140 can be exemplified by filter paper, or other woven or non-woven fabric. Other porous material capable of filtering out particles can also be implemented in the present invention. To sum up, by using the detachable snap plate 131, the gasket fitting 132 can be removed easily, and the filtration element 140 or other related components can be replaced easily. The convenience of component replacement is increased, the work efficiency is improved, and the substrate container 10 (shown in FIG. 1) can return to the manufacturing line in a shorter time to carry on the function of containing, supporting, or transporting the substrate 20 (shown in FIG. 1).

Specifically, the present invention provides a method for loading the quick release valve, which may include the following steps. At first step, loading the valve element 133 into the airflow conduit 132a defined by the gasket fitting 132. At second step, fitting the gasket fitting 132 into the fitting sleeve 121 and thereby forming a hermetic sealing between the gasket fitting 132 and the fitting sleeve 121. At third step, fitting the circular structure of the snap plate 131 onto the outer wall of the gasket fitting 132 until the circular structure touch against the flange surface 1323 of the gasket fitting 132. At fourth step, securing the snap plate 131 within the first opening 110a of the substrate container such that the gasket fitting 132 is unable to pass through the snap plate 131. A corresponding method for unloaded the loaded quick release valve of course is also provided, which may include the following steps. At first step, changing state of the snap plate 131 from an engaged state to a disengaged state. At second step, retrieving the snap plate 131 from the first opening 110a so that the circular structure of the snap plate no longer restricts the flange surface 1323. At third step, retrieving the gasket fitting 132 from the first opening 110a.

According to the above-mentioned quick release purge valve and substrate container using the same of the embodiments of the invention, the quick release purge valve allows the gas entering or leaving the substrate container. The substrate container includes the base, and the base includes the cover plate and the bottom plate. The quick release purge valve includes the snap plate, the gasket fitting, and the valve element. The snap plate is detachably engaged to the first opening of the bottom plate and is at most evenly aligned with the bottom plate. The gasket fitting is disposed between the cover plate and the bottom plate and has the airflow conduit communicating the cover plate and the bottom plate. The valve element is disposed in the airflow conduit for limiting the flow direction of the gas. When the snap plate and the bottom plate are in the engaged state, the gasket fitting is fixed by the snap plate and is prevented from moving out of the base. When the snap plate and the bottom plate are in the disengaged state, the gasket fitting is removable from the base. In the quick release purge valve, the snap plate is used to increase the convenience of component replacement, to save work time, and to improve the work efficiency. Further, because the snap plate is at most evenly aligned with the bottom plate, the bottom of the substrate container can be kept flat, which facilitates the transporting of the substrate container and maintains the cleanliness as well.

The ordinal numbers used in the detailed description and claims, such as "first" and "second" do not necessarily indicate their priority orders or up and down directions; on the contrary, they are merely intended to distinguish different elements. It will be apparent to those skilled in the art that various modifications and variations can be made to the structure of the present invention without departing from the scope or spirit of the invention. In view of the foregoing, it is intended that the present invention covers modifications and variations of this invention, provided they fall within the scope of the following claims.

What is claimed is:

1. A quick release purge valve used for a substrate container including a base having a cover plate and a bottom plate, the quick release purge valve comprising:

a snap member including a circular structure having an inner diameter, and the snap member detachably received within a first opening defined at the bottom plate;

a gasket fitting having an airflow conduit defined therein for providing a gas flow into or from the substrate container; and a valve element positioned in the airflow conduit for restricting the airflow;

wherein the gasket fitting has an outer wall and a protruding ring formed on the outer wall, and an outer diameter of the protruding ring is larger than the inner diameter of the circular structure such that the snap member is able to engage with the protruding ring and whereby secure the gasket fitting within the first opening defined at the bottom plate.

2. The quick release purge valve as claimed in claim 1, wherein a periphery of the circular structure is provided with an engaging member for matching with an edge defining the first opening.

3. The quick release purge valve as claimed in claim 1, wherein the protruding ring is formed on the outer wall of the gasket fitting and approximates to an edge of the gasket fitting such that the snap member secures the gasket fitting in the base by a contact between the protruding ring and the circular structure.

4. The quick release purge valve as claimed in claim 1, wherein the gasket fitting has a ring surface defining an opening of the airflow conduit, and an outer diameter of the ring surface is no greater than the inner diameter of the circular structure.

5. The quick release purge valve as claimed in claim 4, wherein the ring surface extends between the bottom plate and the cover plate.

6. The quick release purge valve as claimed in claim 1, wherein the cover plate defines a second opening and has a fitting sleeve encircling the second opening, the outer wall of the gasket fitting is partially in contact with an inside of the fitting sleeve to form a seal.

7. The quick release purge valve as claimed in claim 6, wherein the gas flow enters into the substrate container by sequentially passing through the first opening, the valve element in the airflow conduit and the second opening, or the gas flow leaves from the substrate container by sequentially passing through the second opening, the valve element in the airflow conduit and the first opening.

8. A quick release purge valve used for a substrate container, comprising:

a snap member having a circular structure;

a gasket fitting having an airflow conduit defined therein for providing a gas flow into or from the substrate container; and a valve element positioned in the airflow conduit for restricting the airflow;

wherein the gasket fitting has an outer wall and a flange surface formed on the outer wall, the flange surface touches against the circular structure of the snap member such that the snap member fits onto the outer wall of the gasket fitting.

9. The quick release purge valve as claimed in claim 8, wherein the circular structure has a ring surface touching against the flange surface of the gasket fitting such that the gasket fitting is unable to pass through the snap member.

10. The quick release purge valve as claimed in claim 8, wherein the gasket fitting has ring surface that defines an opening of the airflow conduit, and an outer diameter of the ring surface is no greater than an inner diameter of the circular structure.

11. A substrate container, comprising:
   a base including a bottom plate and a cover plate, the bottom plate defining at least one first opening, the cover plate defining at least one second opening, the first opening corresponding to the second opening; and
   an outer cover for engaging with the base to form a sealed state; and
   at least one quick release purge valve comprising:
      a snap member having a circular structure;
      a gasket fitting defining an airflow conduit therein; and
      a valve element positioned within the airflow conduit,
   wherein the airflow conduit communicatively connects to the first opening and the second opening, the gasket fitting has an outer wall and a flange surface formed on the outer wall, the flange surface matches with the circular structure such that the gasket fitting is held within the first opening defined by the bottom plate.

12. The substrate container as claimed in claim 11, wherein the snap member is detachably received in the first opening defined by the bottom plate.

13. The substrate container as claimed in claim 11, wherein the flange surface has an outer diameter that is larger than an inner diameter of the circular structure.

14. The substrate container as claimed in claim 11, wherein the gasket fitting has a ring surface, and an outer diameter of the ring surface is no greater than an inner diameter of the circular structure.

15. The substrate container as claimed in claim 11, wherein the circular structure has a ring surface being in contact with the flange surface of the gasket fitting such that the gasket fitting is unable to pass through the snap member.

16. A method for loading at least on quick release purge valve in a substrate container, the quick release purge valve comprising a snap member having a circular structure, a gasket fitting defining an airflow conduit and a valve element, wherein the gasket fitting has an outer wall and a flange surface formed on the outer wall, and the substrate container is provided with at least one first opening and at least one second opening corresponding to the first opening, the second opening is provided with a fitting sleeve, the method comprising following steps:
   loading the valve element into the airflow conduit defined by the gasket fitting;
   fitting the gasket fitting into the fitting sleeve to form a seal between the gasket fitting and the fitting sleeve;
   fitting the circular structure of the snap member onto the outer wall of the gasket fitting until the circular structure touches against the flange surface; and
   securing the snap member within the first opening such that the gasket fitting is unable to pass through the snap member.

17. A method for unloading at least one quick purge release valve from a substrate container providing at least one first opening and at least one second opening corresponding to the first opening, the quick release purge valve comprising a snap member having a circular structure, a gasket fitting defining an airflow conduit and a valve positioned in the airflow conduit, wherein the gasket fitting has an outer wall and a flange surface formed on the outer wall, the snap member is detachably received within the first opening with the circular structure matching the flange surface to thereby restrict the gasket fitting inbetween the first opening and the second opening, the method comprising following steps:
   changing the state of snap member from an engaged state to a disengaged state;
   retrieving the snap member from the first opening such that the circular structure no longer restricts the flange surface; and
   retrieving the gasket fitting from the first opening.

* * * * *